United States Patent [19]

Charych et al.

[11] Patent Number: 5,134,702
[45] Date of Patent: Jul. 28, 1992

[54] SERIAL-TO-PARALLEL AND PARALLEL-TO-SERIAL CONVERTER

[75] Inventors: Harold Charych, Setauket, N.Y.; Sandip Chattopadhya, Stoneham, Mass.

[73] Assignee: NCR Corporation, Dayton, Ohio

[21] Appl. No.: 854,380

[22] Filed: Apr. 21, 1986

[51] Int. Cl.$^5$ .................................................. G06F 5/00
[52] U.S. Cl. ........................................ 395/500; 364/238; 364/239.2; 364/239; 364/244.3; 364/DIG. 2; 395/250
[58] Field of Search ............... 341/100, 101, 88, 50; 370/84; 395/509, 275, 250; 364/200 MS File, 900 MS File

[56] References Cited

U.S. PATENT DOCUMENTS

| | | | |
|---|---|---|---|
| 3,946,379 | 3/1976 | Lippman | 341/100 |
| 4,048,625 | 9/1977 | Harris, Jr. et al. | 364/900 |
| 4,125,870 | 11/1978 | Suzuki | 364/900 |
| 4,151,609 | 4/1979 | Moss | 365/233 |
| 4,165,541 | 8/1979 | Varshney et al. | 365/219 |
| 4,216,460 | 8/1980 | Baldwin | 341/100 |
| 4,284,953 | 8/1981 | Hepworth et al. | 364/900 |
| 4,298,936 | 11/1981 | Shapiro | 364/200 |
| 4,375,078 | 2/1983 | Thoma | 364/200 |
| 4,377,806 | 3/1983 | Elliott et al. | 341/101 |
| 4,404,426 | 9/1983 | Safford | 341/100 |
| 4,409,587 | 10/1983 | Scott | 341/100 |
| 4,425,562 | 1/1984 | De Niet | 341/100 |
| 4,426,685 | 1/1984 | Lorentzen | 364/900 |
| 4,429,300 | 1/1984 | Yamasawa | 341/100 |
| 4,447,804 | 5/1984 | Allen | 341/100 |
| 4,482,956 | 11/1984 | Tallman | 364/200 |
| 4,486,854 | 12/1984 | Yuni | 364/900 |
| 4,497,041 | 1/1985 | Braun | 364/900 |
| 4,586,159 | 4/1986 | Thomas et al. | 364/900 |
| 4,620,180 | 10/1986 | Carlton | 341/100 |
| 4,674,064 | 6/1987 | Vaughn | 364/900 |
| 4,696,498 | 7/1983 | Jackson | 371/20 |
| 4,734,850 | 3/1988 | Torii et al. | 364/200 |
| 4,750,149 | 6/1988 | Miller | 364/900 |
| 4,764,894 | 8/1988 | Codrington | 364/900 |

*Primary Examiner*—Thomas C. Lee
*Assistant Examiner*—Eric Coleman

[57] ABSTRACT

A serial-to-parallel and parallel-to-serial data format converter has a plurality of first-in, first-out (FIFO) buffer memory devices, an input circuit for receiving serial data bits, an output circuit for outputting serial data bits and a clocking circuit for clocking selected ones of the data bits into and out of selected ones of the FIFO buffer memory devices. The clocking circuit clocks serial data bits either into or out of each of the FIFO buffer memory devices at a rate slower than the rate of the receipt of the serial data bits by the input circuit, or the rate of the outputting of serial data bits by the output circuit, respectively.

15 Claims, 9 Drawing Sheets

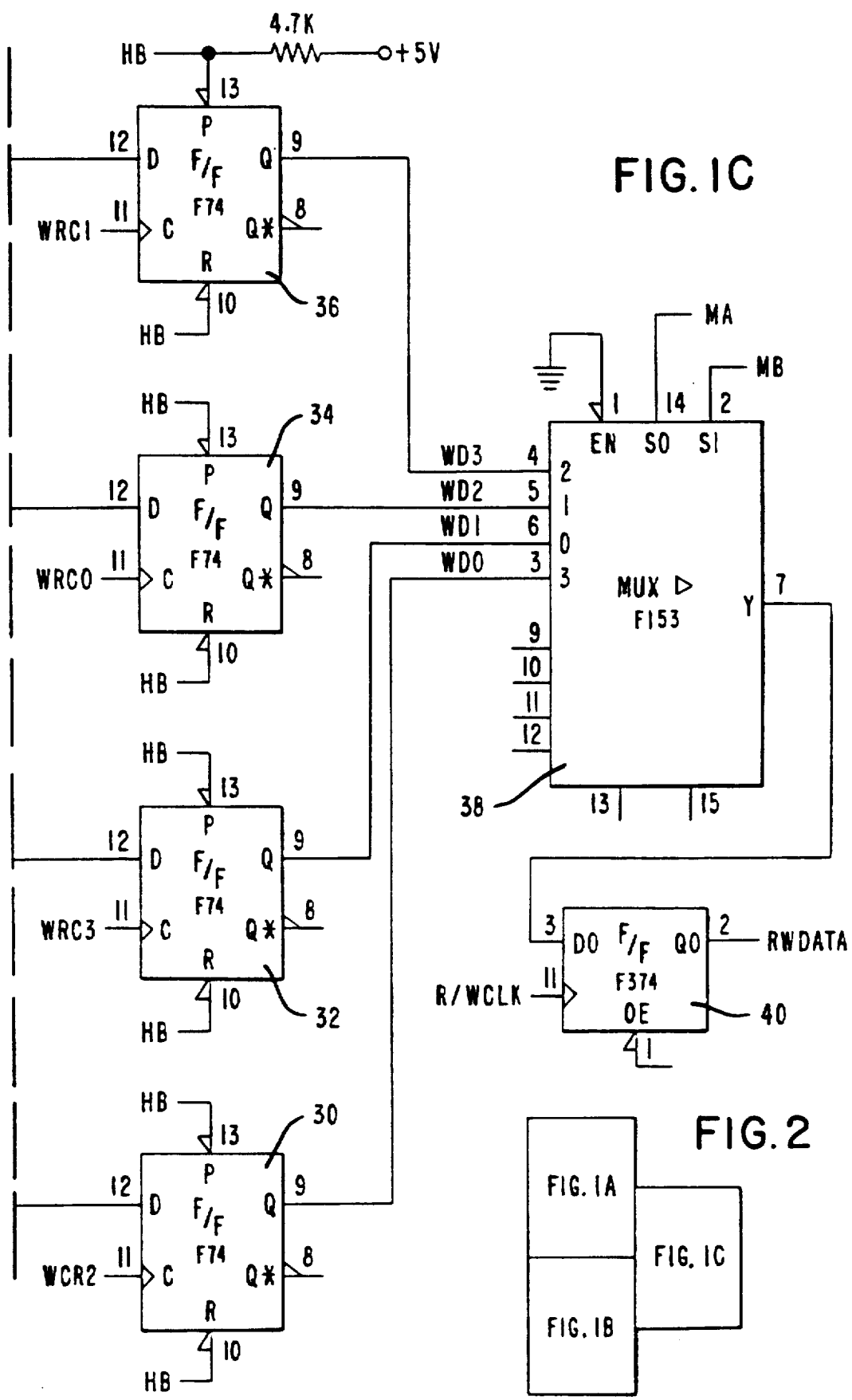

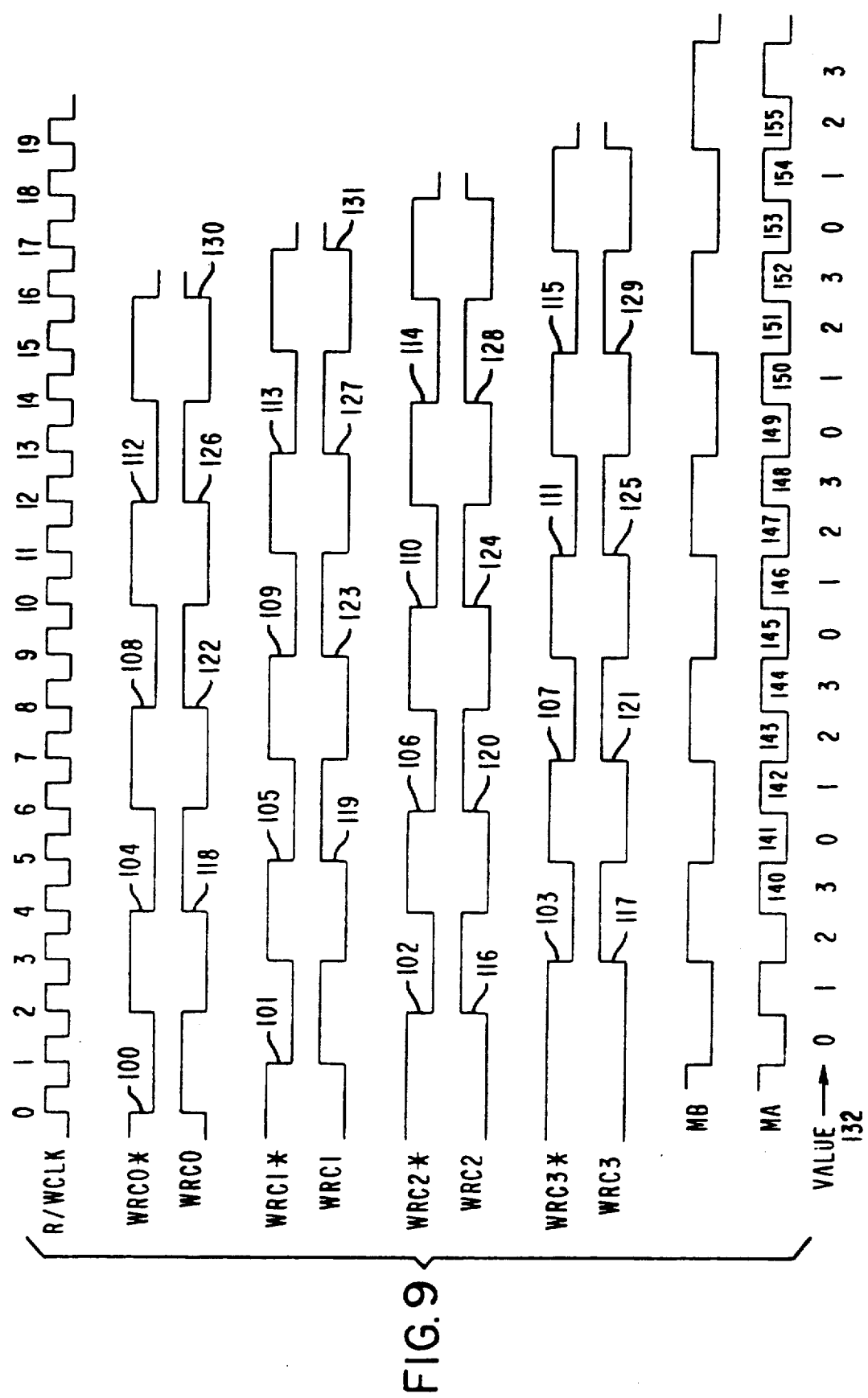

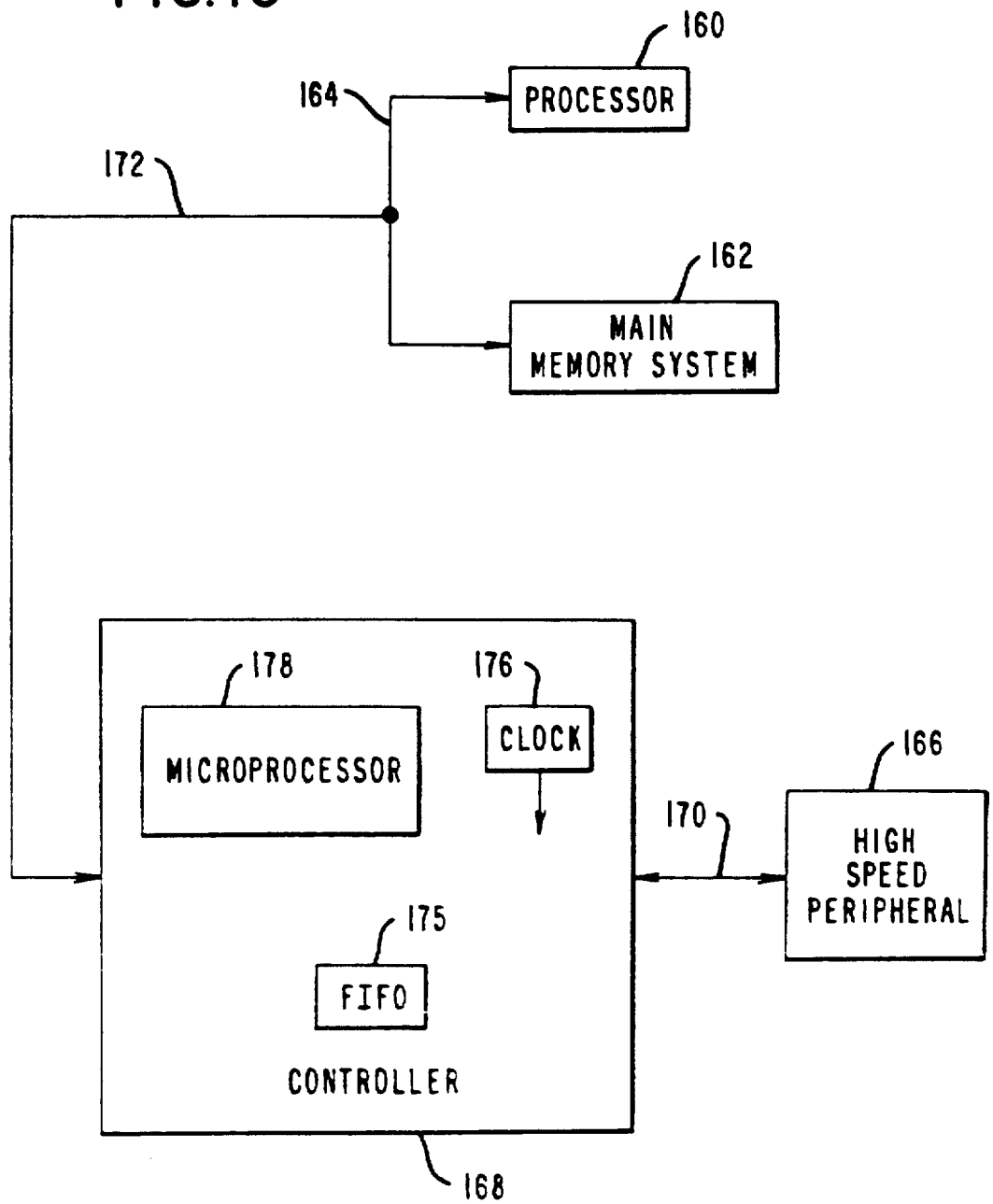

SERIAL-TO-PARALLEL AND PARALLEL-TO-SERIAL CONVERTER

BACKGROUND OF THE INVENTION

The present invention relates to a device for converting serial data to parallel data, and for converting parallel data to serial data. It more particularly relates to circuitry which increases the serial data input and output rate of a serial-to-parallel and parallel-to-serial converter.

In data processing systems, there is frequently a need to convert serial data to parallel data or to convert parallel data to serial data. For instance, in many computer peripheral devices, such as tape drives and disk drives, data is sent to and received from the peripheral devices in a serial format. However, data is sent between the processing unit and the memory unit of the computer in a parallel format. Thus, when sending data from the computer to the peripheral device, it is necessary to convert the data from a parallel format to a serial format; and when sending data from the peripheral device to the computer, it is necessary to convert the data from a serial format to a parallel format. Serial-to-parallel and parallel-to-serial converters have been developed to handle the conversion of data between the serial and parallel formats.

The speed at which the computer can send data to or receive data from the peripheral device is limited by the rate at which said data is transmitted and the speed at which the converter can convert data from one format to the other. Thus, the advantages of a high speed peripheral can be defeated by a converter which is slow in converting the data from the serial to parallel or the parallel to serial formats.

U.S. Pat. No. 3,742,456 by McFiggans et al. and issued Jun. 26, 1973 for "Apparatus For Selectively Formatting Serial Data Bits Into Separate Data Characters" discloses an interface apparatus which formats serially received data bits into preassigned groups of bits for transmission to a digital computer.

U.S. Pat. No. 4,284,953 by Hepworth et al. and issued Aug. 18, 1981 for "Character Framing Circuit" discloses a digital logic circuit which includes a shift register for serial loading and parallel unloading of a continuous stream of synchronous serial data characters.

U.S. Pat. No. 4,393,301 by Svendsen and issued Jul. 12, 1983 for "Serial-To-Parallel Converter" discloses a circuit having a plurality of storage means for storing one bit of data, a synchronous counter for counting received consecutive serial data bits, a decoder for sequentially enabling one of the storage means for sequentially storing one data bit, and a parallel clock for simultaneously releasing all of the stored data bits in the form of a parallel word.

U.S. Pat. No. 4,473,879 by Tachiuchi et al. and issued Sep. 25, 1984 for "Data Transfer System In Which Time For Transfer Of Data To A Memory Is Matched To Time Required To Store Data In Memory" discloses a data transfer system having a serial/parallel data converting means, a CPU, and means for making the CPU operation time equal to the transfer time.

U.S. Pat. No. 4,497,041 by Braun and issued Jan. 29, 1985 for "Parallel Serial Controller" discloses a computer-peripheral interface which includes a latch to receive parallel data from a peripheral, a single FIFO memory and a parallel-serial converter for transmission of data to a controlling computer.

SUMMARY OF THE INVENTION

A data format converter is disclosed comprising a plurality of first-in, first-out (FIFO) buffer memory devices, an input circuit for receiving serial data bits, and a clocking circuit for clocking selected ones of the serial data bits to selected ones of the FIFO buffer memory devices. The clocking circuit clocks the serial data bits into each of the FIFO buffer memory devices at a rate slower than the rate of the receipt of the serial data bits by the input circuit.

It is an object of the present invention to provide a circuit for increasing the serial data input and output rate of a serial-to-parallel and parallel-to-serial converter.

It is also an object of the present invention to provide a serial-to-parallel and parallel-to-serial converter having a plurality of FIFO buffer memory devices each of which receives and sends serial data bits at a rate less than the rate that the serial data bits are inputted to and outputted from the converter.

It is also an object of the present invention to provide a serial-to-parallel and parallel-to-serial converter having a decode circuit for directing serial data bits to and from selected FIFO buffer memory devices such that serial data bits may be inputted to and outputted from said converter at a rate greater than the operating speed of each individual FIFO buffer memory device.

It is also an object of the present invention to provide a serial-to-parallel converter having a detector which detects the transmission of a sync byte, and which starts the conversion of serial data bits to parallel data bits after a designated number of serial data bits have been transmitted after the sync byte.

These and other objects of the present invention will become apparent from the drawings and the description of the preferred embodiment disclosed herein.

BRIEF DESCRIPTION OF THE DRAWINGS

FIGS. 1A-1C, arranged as shown in FIG. 2, form a schematic diagram of a serial-to-parallel and parallel-to-serial converter circuit of the present invention;

FIG. 2 is a map showing the relationship of FIGS. 1A-1C;

FIG. 9 forms a timing diagram showing the relationship of the clock signals of the ring counter of FIG. 8, multiplexer control signals of the control circuit of FIG. 7, and the master clock signal R/WCLK; and FIG. 10 is a block diagram of a data processing system utilizing the serial-to-parallel and parallel-to-serial converter of the present invention.

DESCRIPTION OF THE PREFERRED EMBODIMENT

The elements of the schematic diagrams of the FIGS. 1A-1C, 2, 3, 5, 7 and 8 include the manufacturer's standard part number, and will be understood by those skilled in the art to identify the devices represented in the schematic diagram of the mentioned figures. The indicated elements may be devices available from Fairchild Camera and Instrument Corporation, Digital Products Division, of South Portland, Me., 04106.

Figure 1A:
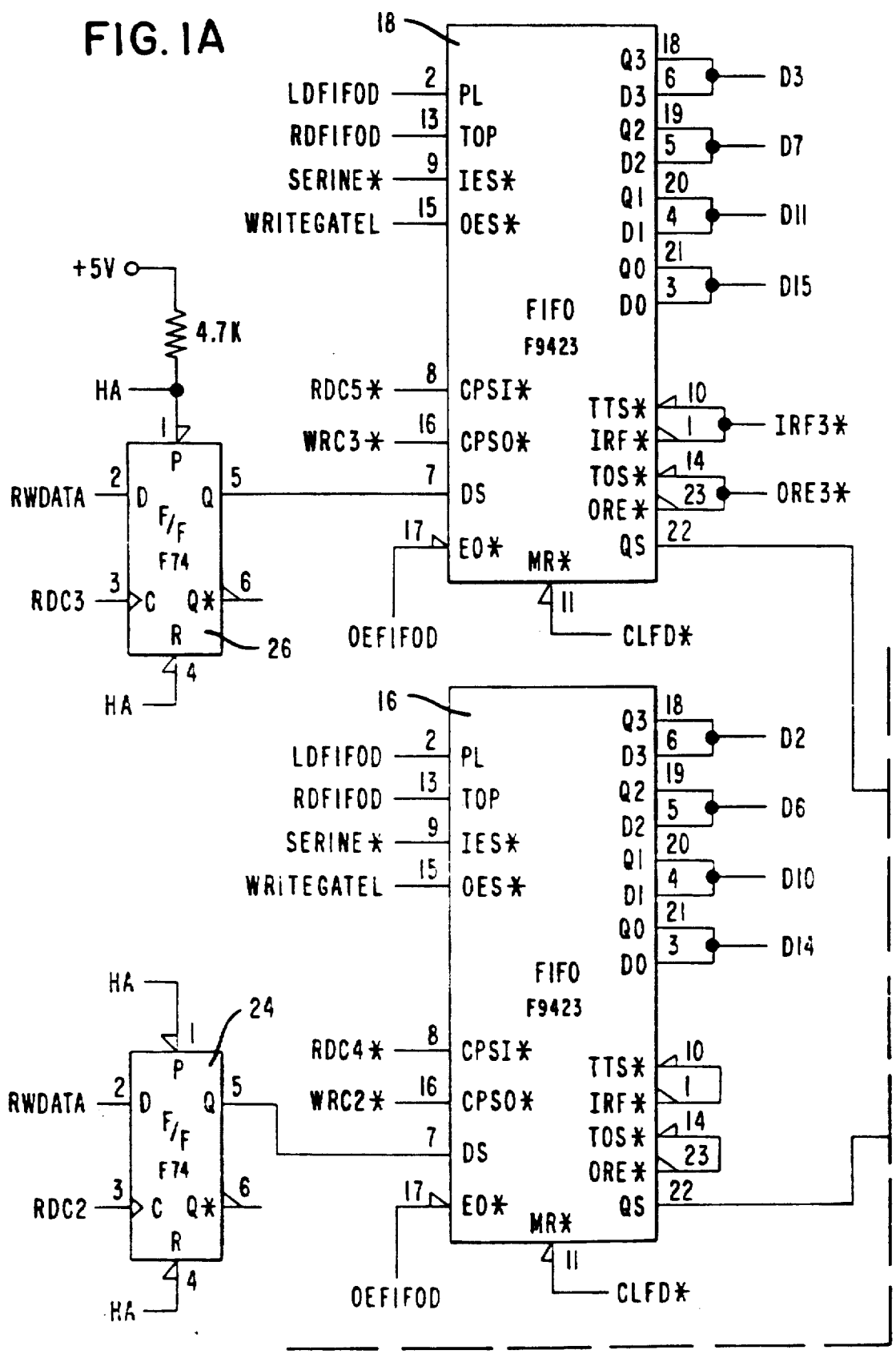
Figure 1B:
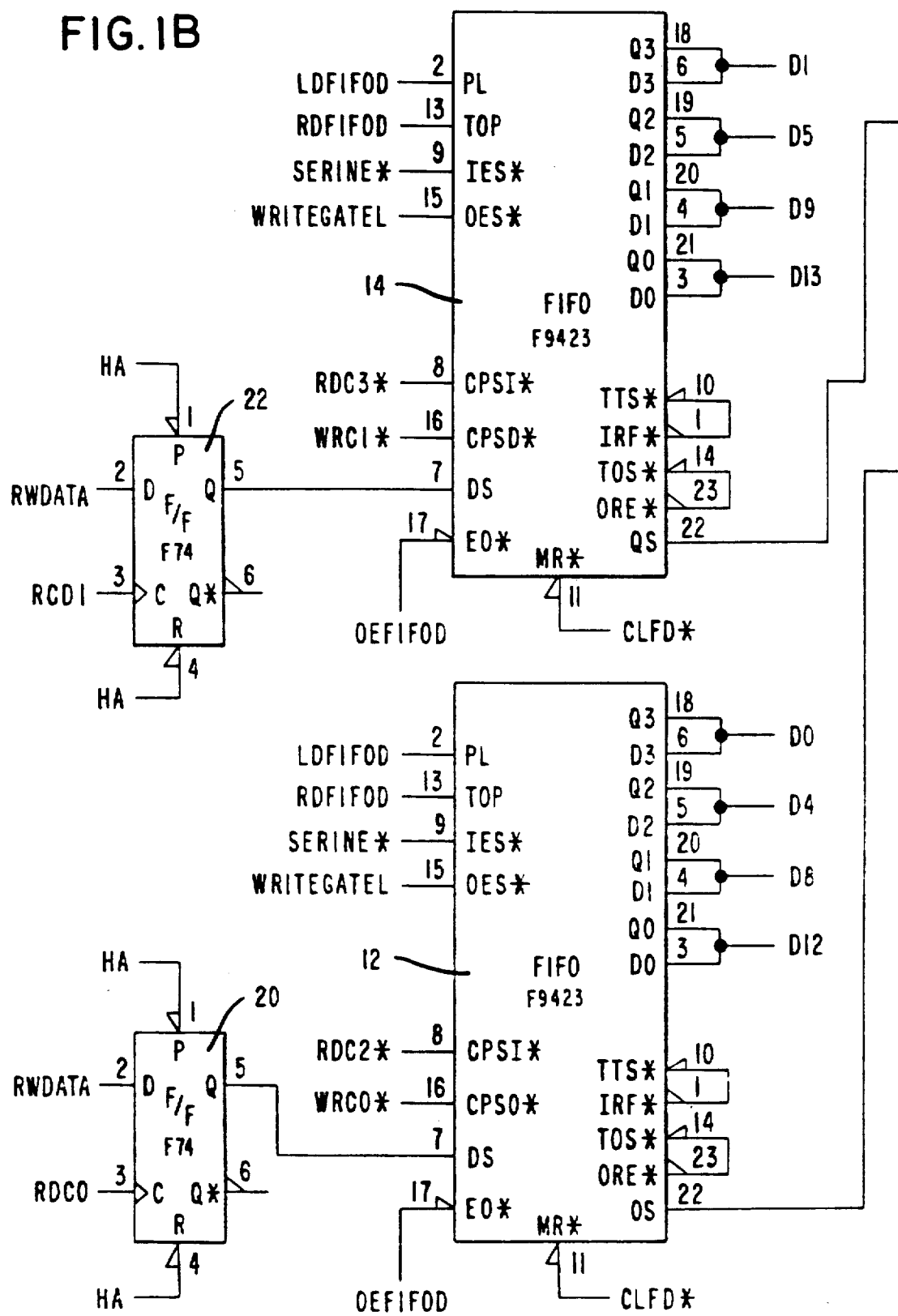

FIGS. 1A-1C, arranged as shown in FIG. 2, form a schematic diagram of a serial-to-parallel and parallel-to-serial converter circuit of the present invention. The converter circuit includes four first-in, first-out (FIFO) buffer memory devices 12, 14, 16 and 18 which may be F9423 devices available from Fairchild. Each device 12, 14, 16 and 18 handles four data bits which may be entered or extracted asynchronously in serial or parallel fashion. Data bits are entered into each of the FIFO buffer memory devices 12-18 on pins 18-21 in a parallel fashion when the parallel load (PL) terminal of pin 2 of each device is high, and may be outputted in a parallel fashion from pins 3, 4, 5 and 6 when the transfer out parallel (TOP) terminal of pin 13 is high. Four data bits may be read into each FIFO buffer memory device 12-18 in a serial fashion on serial data input terminal (DS) of pin 7, and outputted in a serial fashion on the serial data output terminal (QS) of pin 22. Serial data input is enabled when the serial input enable terminal (IES*) of pin 9 is low, and serial data output is enabled when the serial output enable terminal (OES*) is low. A serial data bit is clocked into the FIFO memory devices 12-18 by a clock signal on the serial input clock terminal (CPSI*) of pin 8, and a serial bit is clocked out of the FIFO buffer memory devices 12-18 by a clock on the serial output clock terminal (CPSO*) of pin 16. The clock pulses input into the CPSI* and CPSO* terminals of the devices 12-18 are edge triggered input signals which are activated on the falling edge of the clock signals. The PL and TOP terminals control the parallel loading to and reading from the FIFO buffer memory devices 12-18 by signals LDFIFOD and RDFIFOD respectively. The CPSI* and CPSO* terminals control the serial data reading from and writing to the FIFO buffer memory devices 12-18 by the signal RDC2*-RDC5*, and WRC0*-WRC3*, to be discussed. Serial input data is enabled by the SERINE* signal on the IES* terminals of the FIFO buffer devices 12-18. The remaining input terminals of the FIFO buffer memory devices 12-18 are well understood in the art and will not be discussed further.

D-type flip-flops 20-26 of FIGS. 1A and 1B receive a serial data signal (RWDATA) on their D inputs, and have their noninverted or Q outputs connected to the DS inputs of the FIFO buffer memories 12-18, respectively. The D-type flip-flops 20-26 are clocked by clocking signals RDC0-RDC3 respectively such that serial bits of the RWDATA signal are sequentially clocked into the D-type flip-flops 20-26. During a serial-to-parallel conversion, a low SERINE* signal is inputted to the IES* inputs of the FIFO buffer memory devices 12-18 at the beginning of the transmission of serial data bits by the RWDATA signal to the D-type flip-flops 20-26. The first data bit (D0) is then clocked into the D-type flip-flop 20 by the clock signal RDC0, and subsequently clocked into the FIFO buffer memory device 12 by clock signal RDC2*. The second data bit (D1) is clocked into D-type flip-flop 22 by clock signal RDC1, and subsequently clocked into the FIFO buffer memory device 14 by clock signal RDC3*. In a similar manner, data bit D2 is clocked into D-type flip-flop 24 by clock signal RDC2 and FIFO buffer memory device 16 by clock signal RDC4*, and data bit D3 is clocked into D-type flip-flop 26 by clock signal RDC3 and FIFO buffer memory device 18 by clock signal RDC5*. Data bit D4 is then clocked into D-type flip-flop 20, to be subsequently clocked into FIFO buffer memory device 12. In this manner, data bits D0, D4, D8 and D12 are clocked into FIFO buffer memory device 12, data bits D1, D5, D9 and D13 are clocked into FIFO buffer memory device 14, data bits D2, D6, D10 and D14 are clocked into FIFO buffer memory device 16, and data bits D3, D7, D11 and D15 are clocked into FIFO buffer memory device 18. After the data bits are loaded into the FIFO memory devices 12-18, as described, the data bits are outputted in a parallel fashion by an active low input signal on the EO* input (signal OEFIFOD) of the FIFO buffer memory devices 12-18.

The serial data output (QS) of pin 22 of the FIFO buffer memory devices 12-18 are connected to the D inputs of D-type flip-flops 30-36, respectively (see FIG. 1C). The noninverting or Q output of the D-type flip-flops 30-36 (signals WD0-WD3) are each connected to one of the inputs of a multiplexer 38 which, dependent upon the multiplexer control signals MA and MB on the S0 and S1 inputs, controls which of the signals WD0-WD3 received from the D-type flip-flops 30-36 is multiplexed to the Y output (pin 7) of the multiplexer 38. The Y output of the multiplexer 38 is connected to the D input of a D-type flip-flop 40. Write clock signals WRC0*-WRC3* are received by the serial output clocks (pin 16) of the FIFO buffer memory devices 12-18. The clock inputs of the D-type flip-flops 30-36 receive the write clock signals WRC0-WRC3, with WRC0 connected to flip-flop 34, WRC1 connected to flip-flop 36, WRC2 connected to flip-flop 30, and WRC3 connected to flip-flop 32. The output of D-type flip-flop 30 (WD0) is connected to pin 3, or the third input of the multiplexer 38. The output of the D-type flip-flop 32 (WD1) is connected to pin 6 or the 0 input of the multiplexer 38. The output of the D-type flip-flop 34 (WD2) is connected to pin 5 or the first input of the multiplexer 38. The output of D-type flip-flop (WD3) is connected to pin 4 or the second input of the multiplexer 38. It will thus be understood, that when the value of the signals MA and MB equal zero, the WD1 signal will be outputted at pin 7 of the multiplexer 38; when the value of the MA and MB signals is equal to 1, the WD2 signal will be outputted; when the value of the MA and MB signals is equal to 2, the WD3 signal will be outputted; and when the value of the MA and MB signals is equal to 3, the WD0 signal will be outputted. The multiplexed data bits of the multiplexer 38 are placed on the D input of the D-type flip-flop 40, and clocked by a master clock signal (R/WCLK) to the noninverting or Q output of the flip-flop 40 as the RWDATA signal.

Figure 3:
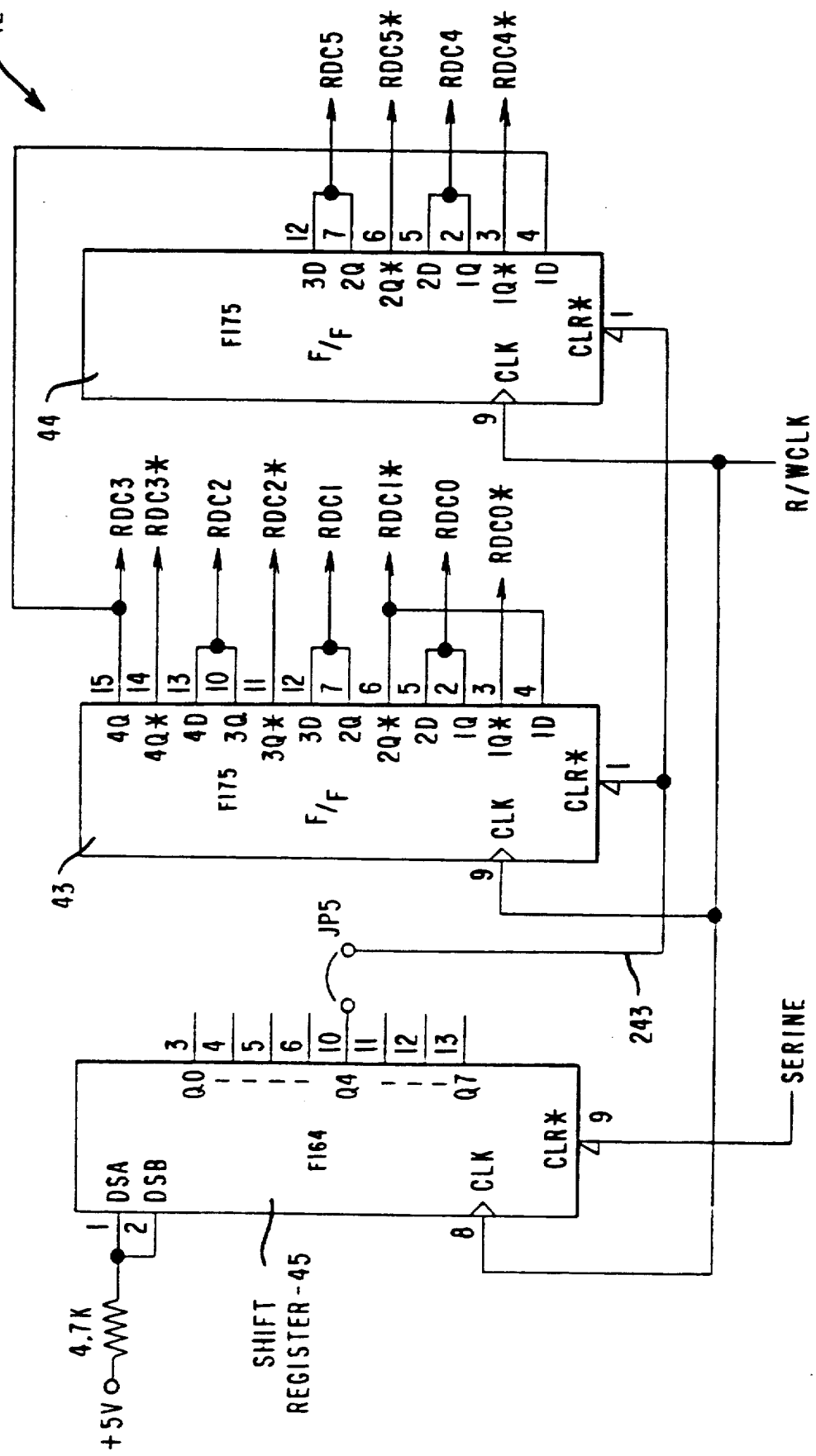
FIG. 3 is schematic diagram of a ring counter for generating clock signals for use by the circuit of FIGS. 1A-1C during serial-to-parallel conversions.

Serial-to-parallel conversion will now be discussed. FIG. 3 is a schematic diagram of a ring counter 42 for generating clock signals for clocking serial data into the D-type flip-flops 20-26 and the FIFO buffer memory devices 12-18 of FIGS. 1A and 1B. The ring counter 42 of FIG. 3 is made up of two quadruple D-type flip-flops 43 and 44 whose clock inputs (pin 9) are connected to the R/WCLK signal. The flip-flop 43 has its 1D input (pin 4) connected to the 2Q* output (pin 6), and its 2D, 3D and 4D inputs (pins 5, 12 and 13), connected to its 1Q, 2Q and 3Q outputs (pins 2, 7 and 10), respectively. The 4Q output (pin 15) of flip-flop 43 is connected to the 1D input (pin 4) of the flip-flop 44. The 2D input and the 3D input (pins 5 and 12) of the flip-flop 44 are connected to its 1Q output and 2Q output (pins 2 and 7), respectively. A shift register 45 is provided having its clear input (pin 9) connected to receive a serial enable (SERINE) signal. The clock input (pin 8) of the shift register 45 receives the R/WCLK signal. A jumper JP5 connects the Q4 output (pin 10) of the shift register 45 to a conductor 243, which is connected to the clear inputs (pin 1) of the flip-flops 42 and 43.

It will be understood that when the SERINE signal goes low, the Q0-Q7 outputs (pins 3-6 and 10-13) of the shift register 45 go low. The low on the Q4 output of the shift register 45 resets the flip-flops 43 and 44 such that their Q outputs go low and the Q* outputs go high. After the SERINE signal goes high, receipt of successive R/WCLK clock pulses successively cause each of the Q outputs Q0-Q7 of the shift register 45 to go high. On the receipt of the fifth R/WCLK clock pulse after the SERINE signal goes high, the flip-flops 43 and 44 will be enabled as the Q4 output on pin 10 of the shift register 45 goes high. With flip-flops 43 and 44 thus enabled, the counter 42 of FIG. 3 starts to count, thereby starting the serial-to-parallel conversion cycle on the next R/WCLK clock pulse.

Since the 1D input of flip-flop 43 is connected to the 2Q* output of the flip-flop 43, the RDC0 signal will remain high and the RDC0* will remain low for 2 clock pulses of the signal R/WCLK. With the flip-flops 43 and 44 connected as described, an output signal, each having a train of pulses, will be generated by each of the Q and Q* outputs of the flip-flops 43 and 44, with each train of pulses having a width of 2 clock pulses of the R/WCLK signal and delayed by 1 clock pulse of the R/WCLK signal from the preceding output signal.

Figure 4:
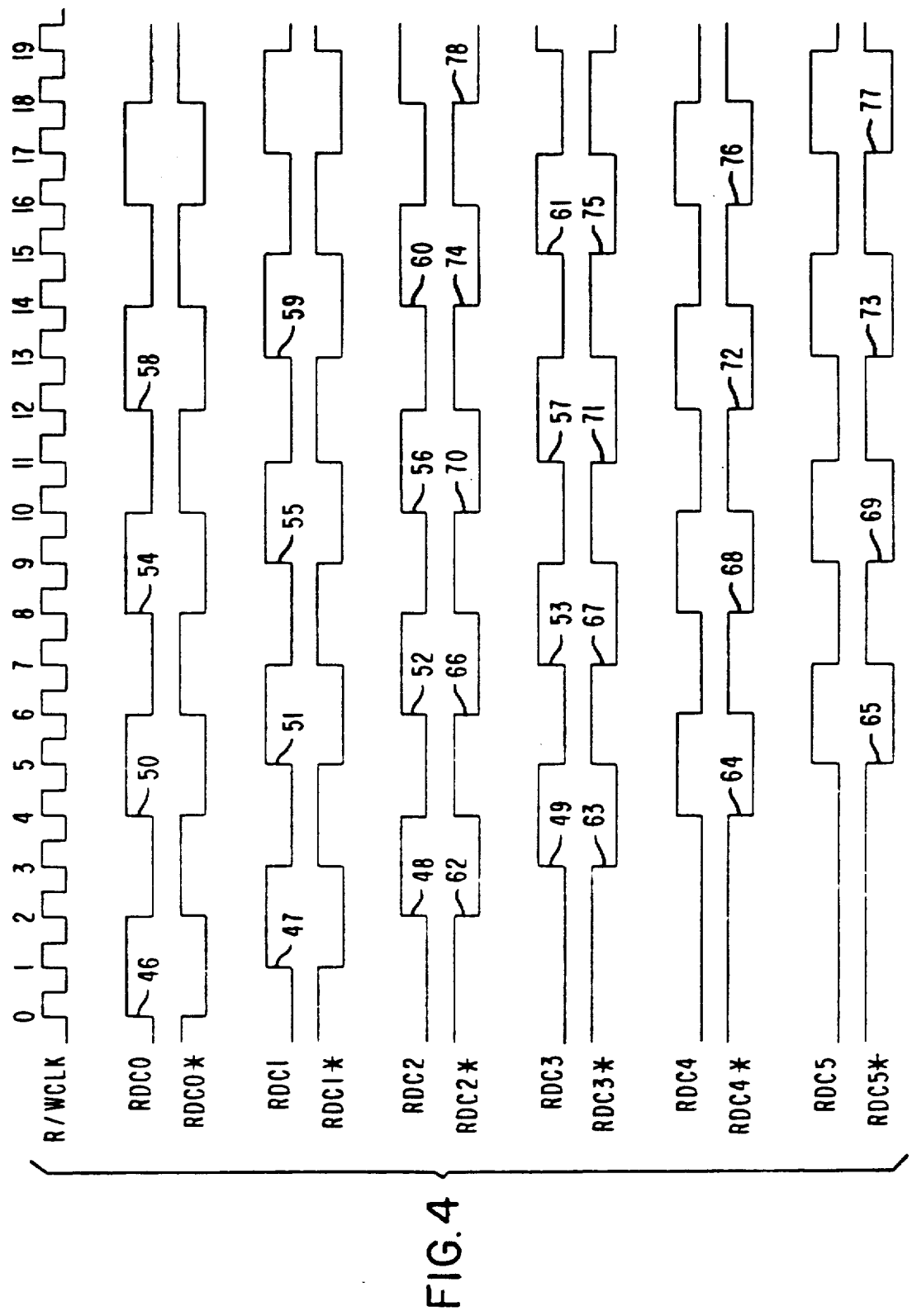
FIG. 4 forms a timing diagram showing the relationship of the clock signals of the circuit of FIG. 3 and a master clock signal R/WCLK.

The RDC0-RDC5 signals and the RDC0*-RDC5* signals are shown in FIG. 4 along with the R/WCLK signal. The R/WCLK signal of FIG. 4 has its clock pulses numbered starting with 0, with clock pulse 0 of the R/WCLK signal occurring upon the enabling of the ring counter 42 of FIG. 3, as explained. Returning now to FIGS. 1A and 1B, it will be seen that the RDC0-RDC3 signals are input into the clock inputs (pin 3) of the flip-flops 20-26 respectively. It will thus be understood that upon the positive going edges of the pulses of the RDC0-RDC3 signals, the serial data bits of the RWDATA signal will be sequentially clocked into the D-type flip-flops 20-26. The RDC2*-RDC5* signals from the ring counter 42 of FIG. 3 are inputted into the serial input clock inputs on pin 8 of the FIFO buffer memory devices 12-18, respectively. Thus, after 2 clock pulses of the R/WCLK signal, the serial data bits stored in the D-type flip-flops 20-26 will be clocked into the respective one of the FIFO buffer memory devices 12-18 by the RDC2*-RDC5* signals, respectively.

Returning to FIG. 4, positive going edges 46-61 of the RDC0-RDC3 signals will clock serial data bits from the RWDAT signal into respective ones of the D-type flip-flops 20-26. Positive going edges 46-61 provide for clocking 16 serial bits in sequential order, with every fifth serial bit going to the same D-type flip-flop 20-26. Negative going edges 62-77 of signals RDC2*-RDC5*, clock serial bits from respective ones of the D-type flip-flops 20-26 into corresponding ones of the FIFO buffered memory devices 12-18. Thus, at negative going edge 77 of RDC5* signal, all 16 serial data bits will have been clocked into the FIFO buffer memory devices 12-18.

The parallel data bits are identified in FIGS. 1A and 1B as D0-D15, and are grouped in groups of four, with D0, D4, D8 and D12 being outputted by FIFO buffer memory device 12; data bits D1, D5, D9 and D13 being outputted by FIFO buffer memory device 14; data bits D2, D6, D10 and D14 being outputted by FIFO buffer memory device 16; and data bits D3, D7, D11 and D15 being outputted by FIFO buffer memory device 18.

Figure 5:
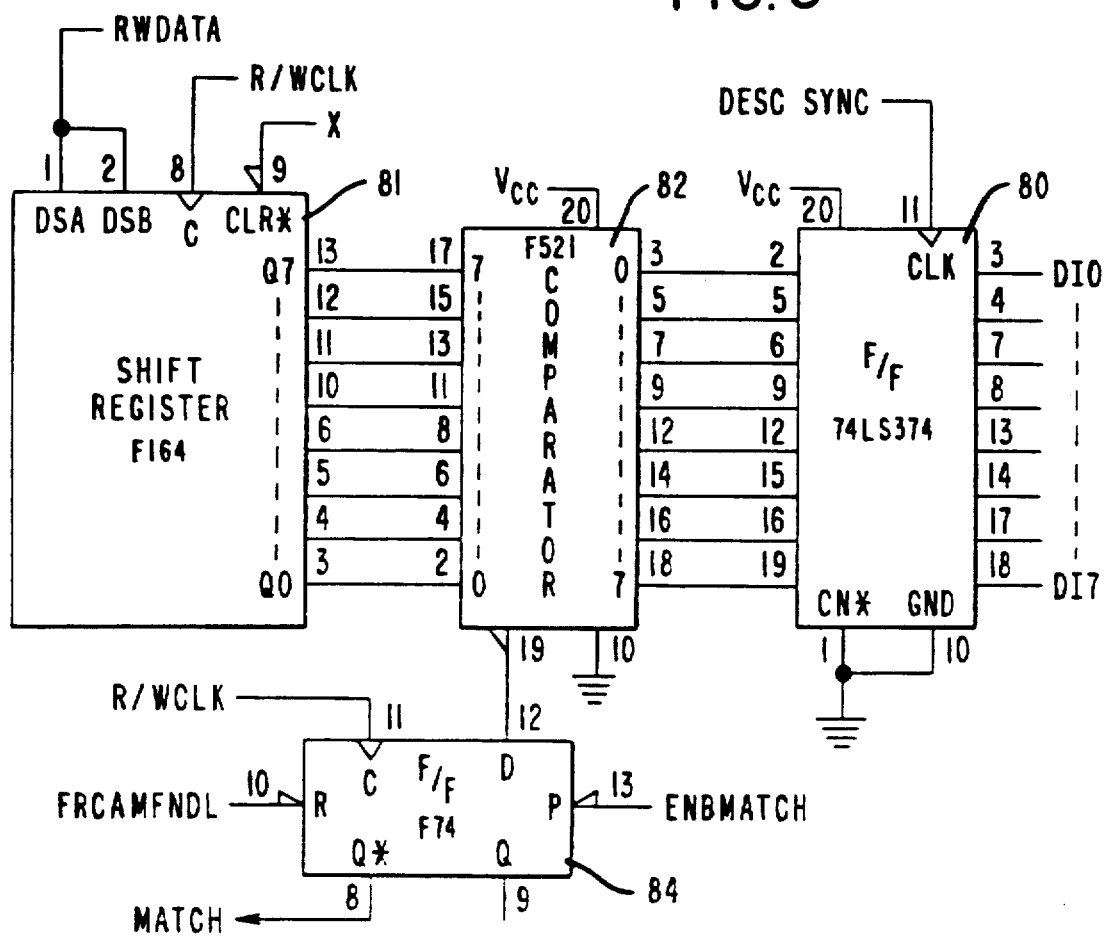
FIG. 5 is a schematic diagram of a sync byte detector circuit during a serial-to-parallel conversion.

FIG. 5 is a sync byte detector circuit for use in determining when the outputs of the ring counter 42 of FIG. 3 should be cleared and the ring counter 42 should start counting. The circuit of FIG. 5 includes a data register 80, a shift register 81, and a comparator 82. The data register 80 has eight input pins for receiving the data input bits D10-D17 of a synchronizing or sync byte. When the sync byte is presented to the inputs of the data register 80, the DESC SYNC signal on its clock input (pin 11) is enabled to store the sync byte in the data register 80. Thereafter, the sync byte is presented at the outputs of the data register 80, which are connected to one set of compare inputs of the comparator 82. A shift register 81 is provided having its outputs Q0-Q7 attached to inputs on the other set of compare inputs of the comparator 82. The serial data bits of the RWDATA signal are presented to the data inputs (pins 1 and 2) of the shift register 81. These serial bits are clocked into the shift register 81 by clock pulses of the R/WCLK signal on the clock input (pin 8). When the comparator 82 determines that the serial data bits of the RWDATA signal are the same as the sync byte stored in the data register 80, its data output signal (pin 19) goes from a high to a low. A D-type flip-flop 84 has its D terminal connected to the output of the comparator 82. The data output from the comparator 82 is thus clocked into the D-type flip-flop 84 by clock pulses of the R/WCLK signal. When the data output on pin 19 of the comparator 82 goes low, the inverted or Q* output (pin 8) of the D-type flip-flop 84 goes high, thus generating a high MATCH signal. Thus, when the MATCH signal of FIG. 5 goes high, this indicates that the sync byte of the serial data has been detected and the ring counter 42 of FIG. 3 should begin counting.

Figure 6:
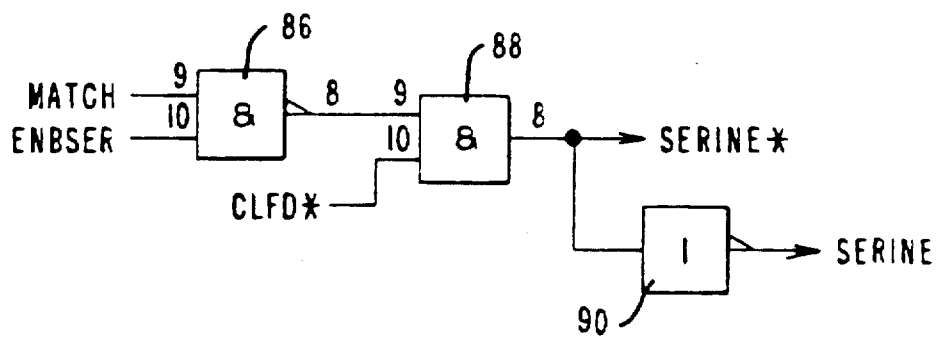
FIG. 6 is a schematic diagram of an enabling circuit for enabling the circuit of FIGS. 1A-1C to load serial data, and for enabling the ring counter of FIG. 3 when a sync byte has been detected by the sync byte detector of FIG. 5.

FIG. 6 is an enabling circuit for enabling the shift register 45 of the ring counter of FIG. 3. The circuit of FIG. 6 includes a NAND gate 86 which has one input for receiving the MATCH signal of FIG. 5, and a second input for receiving an enable serial (ENBSER) signal. The ENBSER signal is transmitted to the NAND gate 86 upon the transmitting of serial data bits of the RWDATA signal for conversion from serial data to parallel data. Thus, when serial data transmission is started, the ENBSER signal goes high. When the sync byte in the serial data is detected by the circuit of FIG. 5, the MATCH signal goes high, making the output of the NAND gate 86 low. The output of the NAND gate 86 is connected to one input of an AND gate 88 whose other input receives a clear FIFO data signal (CLFD*). Thus when the output of the NAND gate 86 and the CLFD* signal are both high, the output of the AND gate 88 (SERINE*) is high. An inverter 90 inverts the SERINE* signal to the SERINE signal. It will be noted that the CLFD* signal of FIG. 6 is also connected to the master reset terminal of the FIFO buffer memories 12-18 of FIGS. 1A and 1B. Thus when the CLFD* signal is low to reset the FIFO buffer memory devices 12-18, the SERINE* output of AND gate 88 of FIG. 6 also goes low. After the FIFO buffer memory devices 12-18 are thus reset, the CLFD* signal goes high. With the output of the NAND gate 86 high, the SERINE* signal goes high. The SERINE signal output from inverter 90 then goes low, clearing the shift register 45 of FIG. 3. This causes the Q4 output of shift register 45 to go low, clearing the flip-flops 43 and 44 of the ring counter 42, as previously discussed.

When serial data is to be transmitted, the ENBSER signal is made high. When the sync byte is detected by the comparator 82 of FIG. 5, as previously discussed, the MATCH signal from the D-type flip-flop 84 goes high, which is inputted into NAND gate 86 along with the high ENBSER signal, making the output of the NAND gate 86 go low. This low is inputted into the AND gate 88 making the SERINE* signal low and the SERINE signal high. With the SERINE signal high, the shift register 45 begins to shift high signals from its Q0 to Q7 outputs with the receipt of every clock pulse of the signal R/WCLK. Thus after five clock pulses of the R/WCLK signal, the Q4 output of the shift register 45 goes high, allowing the ring counter 42 to output clock pulses in the manner shown in FIG. 4, as previously discussed. In this manner, the first five serial bits after the sync byte of the serial data has been detected are ignored, and not converted from serial to parallel data. It will be noted that the shift register 45 then acts to hold a high on its Q4 output until the ring counter 42 is reset. It will also be noted that the SERINE* signal is inputted into the IES* terminal of the FIFO buffer memory devices 12-18 of FIGS. 1A and 1B to enable the input of serial data into the FIFO buffer memory devices 12-18. It will be understood that the number of bits ignored after the detecting of the sync byte may be varied by changing which of the Q0-Q7 outputs of the shift register 45 is connected to the CLR* inputs of the flip-flops 42 and 43 of FIG. 3, by a jumper such as jumper JP5.

Returning to FIG. 5, the ENBMATCH and FRCAMFNDL signals are provided to the preset and reset inputs of the D-type flip-flop 84. Before the sync byte is to be detected by the comparator 82, the ENBMATCH signal is low and the FRCAMFNDL is high, making the inverted or Q* signal of the flip-flop 84 low. During the time when the comparator 82 is comparing the serial data bits from shift register 81 with the sync byte stored in data register 80, both the ENBMATCH and FRCAMFNDL signals are high. After a match has been found, the FRCAMFNDL signal is made low to maintain the Q* output of the flip-flop 84 high, thus making the MATCH signal high until all of the serial data bits have been transmitted. Maintaining the MATCH signal high, maintains the SERINE* signal low and the SERINE signal high for use by the FIFO buffer memory devices 12-18 of FIGS. 1A and 1B and the ring counter 42 of FIG. 3, as previously discussed.

Thus, it will be understood that the rate of serial data bits of the RWDATA signed is the product of the rate of the serial data bits inputted into each of the FIFO buffer memory devices of 12-18 of FIGS. 1A and 1B times the number of FIFO buffer memory devices. Or, in other words, in the present example, the rate of the serial data bits inputted into each FIFO buffer memory device 12-18 is only one forth of the rate of the serial data bits of the RWDATA signal.

Figure 7:
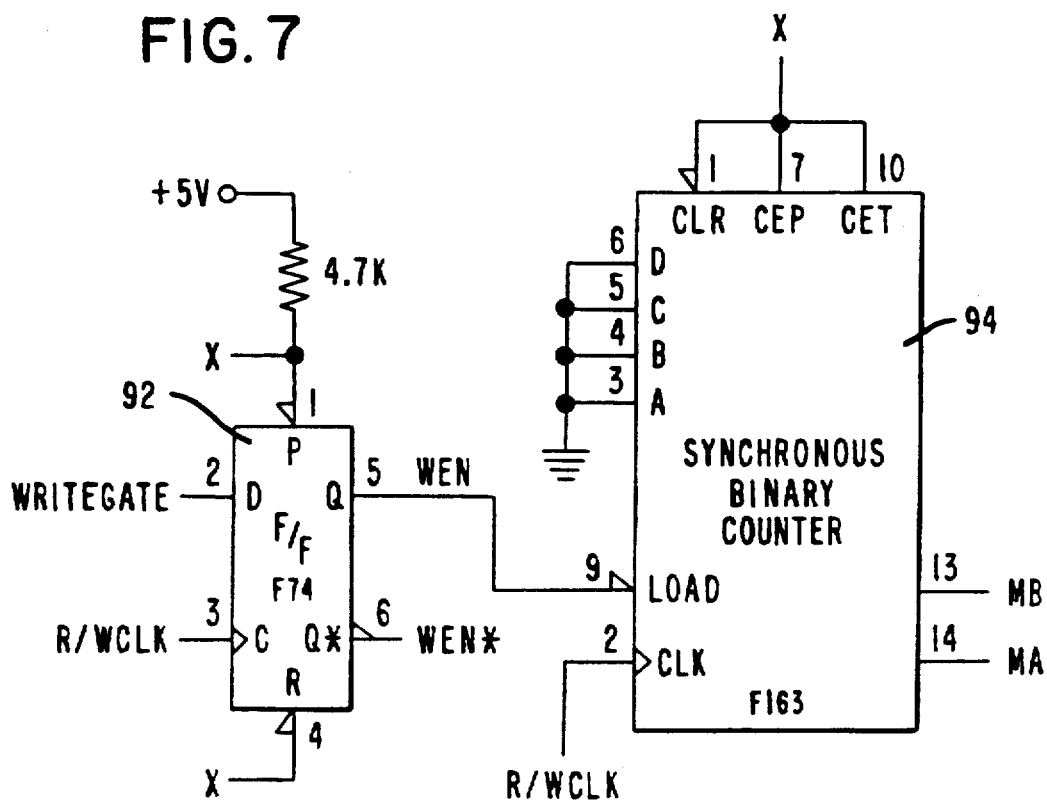
FIG. 7 is a schematic diagram of a control signal generator and multiplexer control for generating control signals during a parallel-to-serial conversion of the circuit of FIGS. 1A-1C.

Parallel-to-serial conversion will now be discussed. FIG. 7 is a schematic diagram of a control signal generator and multiplexer control. The circuit of FIG. 7 includes a D-type flip-flop 92 whose D input terminal (pin 2) receives a write gate (WRITEGATE) signal, which is high when parallel data is to be converted to serial data. The clock terminal (pin 3) of the D-type flip-flop 92 receives clock pulses of the R/WCLK signal. The noninverted or Q output (pin 5) of the flip-flop 92 generates the write enable (WEN) signal which is connected to the load terminal (pin 9) of a synchronous binary counter 94. The A, B, C and D terminals (pins 3-6) of the counter 94 are grounded, and the clock terminal (pin 2) receives clock pulses of the R/WCLK signal. It will be understood that when the WEN signal is high, the counter 94 counts in a binary fashion outputting signals MA and MB from its output terminals (pins 13 and 14) and having binary values varied from 0 to 3 responsive to clock pulses of the R/WCLK signal on its clock terminal.

Figure 8:
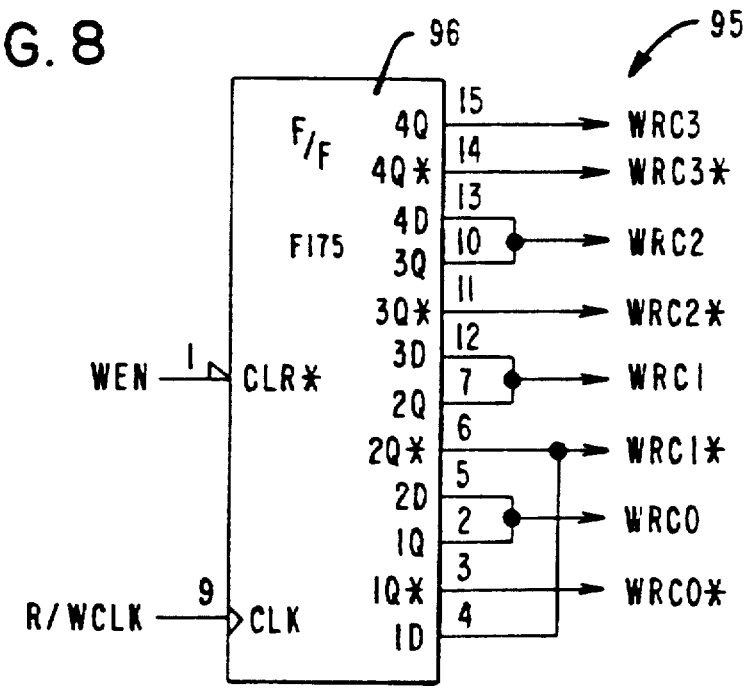
FIG. 8 is a schematic diagram of a ring counter for generating clock signals for use by the circuit of FIGS. 1A-1C during a parallel-to-serial conversion.

FIG. 8 is the schematic diagram of a ring counter 95 which includes a quadruple D-type flip-flop 96. The clear terminal (pin 1) of the flip-flop 96 receives the WEN signal, its clock terminal (pin 9) receives clock pulses of the R/WCLK signal. The 1D terminal (pin 4) of the flip-flop 96 is connected to the 2Q* terminal (pin 6); the 2D terminal (pin 5) is connected to the 1Q output terminal (pin 2); and the 4D terminal (pin 13) is connected to the 3Q output (pin 10). It will be understood that the ring counter 95 generates clock pulses WRC0-WRC3 on the 1Q-4Q outputs (pins 2, 7, 10 and 15) of the flip-flop 96 and clock pulses WRC0* through WRC3* on its 1Q*-4Q* outputs (pins 3, 6, 11 and 14). The clock pulses generated by the counter 95 start when the WEN signal goes positive, and each generated clock pulse has a width of two clock pulses of the R/WCLK signal. Returning to FIGS. 1A-1C, it will be noted that the WRC0*-WRC3* clock signals are connected to the CPS0* inputs of the FIFO buffer memory devices 12-18, respectively. The WRC0 clock signal is connected to the D-type flip-flop 34 of FIG. 1C, the WRC1 clock signal is connected to the D-type flip-flop 36, the WRC2 clock signal is connected to the D-type flip-flop 30, and the WRC3 clock signal is connected to the D-type flip-flop 32. The MA and MB signals from the counter 94 of FIG. 7 are connected to the control terminals S0 and S1 (pins 14 and 2) of the multiplexer 38 of FIG. 1C for multiplexing which of the outputs of the D-type flip-flops 30-36 are multiplexed to the D-type flip-flop 40, as previously discussed.

When data is to be converted from parallel to serial data, the data bits D0-D15 are presented to the parallel data inputs of the FIFO buffer memory devices 12-18, as shown in FIGS. 1A and 1B. The parallel data bits are then loaded into the FIFO buffer memory devices by a high LDFIFOD signal on the PL inputs (pin 2) of the FIFO buffer memory devices 12-18. The data bits are then clocked out in serial fashion from the QS outputs (pin 22) of the FIFO buffer memory devices 12-18, with D0 being clocked out by the WRC0* signal, D1 being clocked out by the WRC1* signal, D3 being clocked out by the WRC2* signal, and D4 clocked out by the WRC3* signal. This sequence starts over again with D5 being clocked out by the WRC0* signal and so forth, until all 16 data bits have been clocked out. The data bits are latched into the D-type flip-flops 30-36 of FIG. 1C by clock signals WRC0-WRC3, which are enabled in the correct sequence and in concert with the control signals MA and MB such that the multiplexer 38 multiplexes the data bits in the correct sequence to the D-type flip-flop 40. The data bits are presented in serial fashion at the output of D-type flip-flop 40 as the serial data RWDATA signal.

FIG. 9 is a timing diagram showing the time relationship of the R/WCLK signal, the clock signals WRC0-WRC3 and WRC0*-WRC3*, and the MA and MB control signals during the conversion of parallel data to serial data. The clock pulse 0 of the R/WCLK signal of FIG. 9 starts when the WRTGATE signal of FIG. 7 goes positive, to indicate that a parallel-to-serial conversion is to start. The parallel data bits D0-D15 are clocked into their respective FIFO buffer memory devices 12-18 of FIGS. 1A and 1B on the negative going edges 100-115 of the clock signals WRC0*-WRC3* of FIG. 9, respectively. Two R/WCLK clock pulses after being clocked into their respective FIFO buffer memory devices 12-18, the data bits are clocked into their respective D-type flip-flops 30-36 on the positive going edges 116-131, respectively, of the clock signals WRC0-WRC3. The value (see 132 of FIG. 9) of the MA and MB control signals controls which data bit is multiplexed at the proper time to the D-type flip-flop 40, as discussed. The data bits D0-D15 are multiplexed to the D-type flip-flop 40 at times 140-155, respectively.

It will then be understood that the rate of serial data bits from the flip-flop 40 is the product of the rate of the serial data bits from the QS (pin 22) of any one of the FIFO buffer memory devices 12-18 of FIGS. 1A and 1B, times the number of FIFO buffer memory devices 12-18.

FIG. 10 is a block diagram of a data processing system utilizing the serial-to-parallel and parallel-to-serial converter of the present invention. In the system of FIG. 10, a processor 160 is connected to a main memory system 162 by a parallel data bus 164. A high speed peripheral 166 such as a high speed disk drive or a high speed type drive, is provided to store data off line or external of the main memory system 162. Data is transmitted between the processor 160 and the main memory system 162 and the high speed peripheral 166 via a controller 168. A serial data bus 170 is provided for transmitting data in a serial format between the controller 168 and the high speed peripheral 166, and a parallel data bus 172 is provided for transmitting data in a parallel format between the controlled 168 and the processor 160 and main memory system 162 via parallel data bus 164.

The controller 168 performs serial-to-parallel conversion on data going from the high speed peripheral 166 to the processor 160 and main memory system 162, and performs parallel-to-serial conversion on data going from the processor 160 and main memory system 162 to the high speed peripheral 166. The controller 168 includes a converter circuit 175, which includes the circuits of FIGS. 1A $\propto$ 1C, 3 and 5-8. The controller 168 also includes a master clock 176 from which the R/WCLK signal, previously discussed, is derived, and is controlled by a microprocessor 178 which generates the various control signals discussed in connection with the foregoing FIGS. 1A-9. The microprocessor 178 may be a 2901A device available from Advanced Micro Devices, Inc. of Sunnyvale, Calif., and programmed in a well known manner. Microprocessor controlled peripheral controllers are well known, and will not be discussed further.

A serial-to-parallel and parallel-to-serial converter has been disclosed which includes FIFO buffer memory devices which are clocked at a much slower clock rate than the inputting or outputting of serial data. Since, in the disclosed embodiment, each FIFO buffer memory device only stores every fourth serial data bit, serial data may be inputted to or outputted from the disclosed embodiment at a rate four times faster than the clocking rate of each individual FIFO buffer memory device. Thus, a serial-to-parallel and parallel-to-serial converter has been disclosed which provides the aforementioned objects. It will be understood by those of ordinary skill in the art that the disclosed embodiment is exemplary only, and that hereafter the various elements disclosed may be replaced by equivalents without departing from the invention hereof, which equivalents are covered by the appended claims.

What is claimed is:

1. A data format converter comprising:
   a plurality of first-in, first-out (FIFO) buffer memory devices;
   input means for receiving serial data bits; and
   clocking means for clocking selected ones of the serial data bits to selected ones of said FIFO buffer memory devices, said clocking means clocking the serial data bits into each of said FIFO buffer memory devices at a rate slower than the rate of the receipt of the serial data bits by said input means;
   wherein each of said FIFO buffer memory devices has a serial data input for receiving serial data, a parallel data output for outputting therefrom the serial data received on its serial data input in a parallel format, and a serial clock input for controlling the inputting therein, of serial data on its serial data input;
   wherein said input means comprises a plurality of flip-flops, one flip-flop for each FIFO buffer memory device, each of said flip-flops having an input for receiving the serial data bits, an output connected to the serial data input of one of said FIFO buffer memory devices, and a clock terminal connected to said clocking means;
   said clocking means generating a series of first clock pulses connected to the clock terminals of said flip-flops for sequentially clocking the serial data bits into successive ones of said flip-flops, and generating a series of second clock pulses connected to the serial clock inputs of said FIFO buffer memory devices for sequentially clocking one at a time the data bits stored in said flip-flops into each of said FIFO buffer memory devices.

2. The data format converter of claim 1 wherein said clocking means comprises:
   a ring counter means having a series of first outputs for generating said first clock signals, and a series of outputs for generating said second clock signals, and starting means for controlling when said ring counter starts outputting first and second clock signals to said series of first outputs and said series of second outputs, respectively.

3. The data format converter of claim 2, and further comprising:
   decoder means having a first input for receiving a synchronizing byte, a second input for receiving the serial data bits, comparator means for comparing the synchronizing byte with the received data bits, and an output for generating a match signal indicative of an equal comparison of the synchronizing byte and the serial data bits, said output connected to said starting means of said clocking means for starting the counting of said ring counter means, thereby making the starting of said ring counter means responsive to the match signal.

4. The data format converter of claim 3 wherein said ring counter means includes delay means for delaying the starting of said ring counter means for a selected number of serial data bits after the generation of the match signal generated by said decoder means.

5. The data format converter of claim 1 wherein each of said FIFO buffer memory devices has a parallel data input for receiving parallel data, a serial data output for outputting the parallel data received on its parallel data input in a serial format, and an enable input for controlling the outputting serial data on its serial data output; wherein said clocking means includes serial output clocking means connected to said enable inputs for generating a series of third clock pulses for clocking selected ones of the serial data bits from selected ones of said FIFO buffer memory devices; and multiplexing means having an input connected to each of said FIFO buffer memory devices, and an output for multiplexing serial data bits from said FIFO buffer memory devices in a serial format;

said clocking means generating the third clock pulses for clocking the serial data bits from said FIFO buffer memory devices at a rate slower than the rate of serial data bits being multiplexed by said multiplexing means.

6. The data format converter of claim 5, and further comprising a plurality of second flip-flops, one of said second flip-flops for each of said FIFO buffer memory devices, each of said second flip-flops having an input for receiving serial data bits from its corresponding FIFO buffer memory device, and an output connected to said multiplexing means, and a clock terminal connected to said clocking means; and said clocking means generating a series of forth clock pulses to the clock terminals of said second flip-flops for sequentially clocking a serial data bit from a corresponding FIFO buffer memory device into one of said second flip-flops.

7. The data format converter of claim 6 wherein said multiplexing means includes a binary counter for producing a count signal starting from a minimum, and being incremented for a number of increments equal to the number of FIFO buffer memory devices, and a multiplexer control connected to said binary counter and being responsive to the count signals such that said multiplexing means multiplexes a serial data bit from one of said second flip-flops with the receipt of each count of the count signal, the count signal being at a rate which is the product of the rate of the serial bits from each FIFO buffer memory device times the number of FIFO buffer memory devices.

8. A data processing system comprising:
processor means for processing data;
memory means for storing data to be processed;
parallel data bus means for transmitting the data to be processed between said processor means and said memory means as a plurality of data bits in parallel format;

a plurality of first-in, first-out (FIFO) buffer memory devices connected to said parallel data bus means, each FIFO buffer memory device having parallel input-output means for receiving and outputting selected ones of the data bits, and serial input-output means for receiving and outputting selected ones of the data bits in a serial format;

peripheral means for storing data, said peripheral means having input-output means for receiving and outputting the data bits in a serial format;

serial data bus means connected to the input-output means of said peripheral means and the serial input-output means of said plurality of FIFO buffer memory devices for transmitting the data bits therebetween in a serial format; and clocking means for clocking selected ones of the data bits of said serial data bus means to selected ones of said FIFO buffer memory devices, said clocking means clocking the data bits into each said FIFO buffer memory devices at a rate slower than the rate of the receipt of the data bits from said serial data bus means.

9. The data processing system of claim 8,
wherein each of said FIFO buffer memory devices has a serial clock input for controlling the inputting therein, of serial data on its serial data input and further comprising:

a plurality of flip-flops, one flip-flop for each FIFO buffer memory device, each of said flip-flops having an input connected to said serial data bus for receiving data bits in a serial format, an output connected to the serial input-output means of one of said FIFO buffer memory devices, and a clock terminal connected to said clocking means;

said clocking means generating a series of first clock pulses connected to the clock terminals of said flip-flops for sequentially clocking one of the data bits into one each of said flip-flops, and generating a series of second clock pulses connected to the serial clock inputs of said FIFO buffer memory devices for sequentially clocking one at a time the data bits stored in said flip-flops into said FIFO buffer memories.

10. The data processing system of claim 9 wherein said clocking means comprises:

a ring counter means having a series of first outputs for generating said first clock signals, and a series of outputs for generating said second clock signals; and starting means for controlling when said ring counter starts outputting first and second clock signals to said series of first outputs and said series of second outputs, respectively.

11. The data processing system of claim 10, and further comprising:

decoder means having a first input for receiving a synchronizing byte, a second input connected to said serial data bus for receiving the data bits in a serial format, comparator means for comparing the synchronizing byte with the received data bits, and an output for generating a match signal indicative of an equal comparison of the synchronizing byte and the serial data bits, said output connected to said starting means of said ring counter, thereby making the starting of said ring counter responsive to the match signal.

12. The data processing system of claim 11 wherein said ring counter means includes delay means for delaying the starting of said ring counter means for a selected number of serial data bits after the generation of the match signal generated by said decoder means.

13. The data processing system of claim 8 wherein each of said FIFO buffer memory devices has an enable input for controlling the outputting of serial data on its serial input-output means;
   wherein said clocking means includes serial output clocking means connected to said enable inputs for generating a third clock signal thereby clocking selected ones of the data bits from selected ones of said FIFO buffer memory devices; and
   multiplexing means having an input connected to each of said FIFO buffer memory devices, and an output connected to said serial data bus means for multiplexing data bits from said FIFO buffer memory devices in a serial format;
   said clocking means generating the third clock signal for clocking the serial data bits from said FIFO buffer memory devices at a rate slower than the rate of serial data bits being multiplexed by said multiplexing means.

14. The data processing system of claim 13, and further comprising a plurality of second flip-flops, one of said second flip-flops for each of said FIFO buffer memory devices, each of said second flip-flops having an input connected to said serial input-output means of its corresponding FIFO buffer memory device for receiving data bits in a serial format, an output connected to said multiplexing means, and a clock terminal connected to said clocking means; and
   said clocking means generating a forth clock signal to the clock terminals of said second flip-flops for sequentially clocking a serial data bit from a corresponding FIFO buffer memory device into one of said second flip-flops.

15. The data processing system of claim 14 wherein said multiplexing means includes a binary counter for producing a count signal starting from a minimum, and being incremented for a number of increments at least equal to the number of FIFO buffer memory devices, and a multiplexer control connected to said counter and being responsive to the count signals such that said multiplexing means multiplexes a serial data bit from one of said second flip-flops with the receipt of each count of the count signal, the count signal being at a rate which is the product of the rate of the serial bits from each FIFO buffer memory device times the number of FIFO buffer memory devices.

* * * * *